United States Patent
Teshima

(10) Patent No.: US 9,642,295 B2
(45) Date of Patent: May 2, 2017

(54) COMPONENT MOUNTING DEVICE

(71) Applicant: FUJI MACHINE MFG. CO., LTD., Chiryu (JP)

(72) Inventor: Chikashi Teshima, Okazaki (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/034,769

(22) PCT Filed: Nov. 11, 2013

(86) PCT No.: PCT/JP2013/080437
§ 371 (c)(1),
(2) Date: May 5, 2016

(87) PCT Pub. No.: WO2015/068305
PCT Pub. Date: May 14, 2015

(65) Prior Publication Data
US 2016/0302336 A1 Oct. 13, 2016

(51) Int. Cl.
*H05K 13/04* (2006.01)
*H05K 13/08* (2006.01)

(52) U.S. Cl.
CPC ......... *H05K 13/0469* (2013.01); *H05K 13/08* (2013.01)

(58) Field of Classification Search
CPC ..... B29C 65/524; B29C 66/876; B29C 66/90; H05K 13/04; H05K 13/0469; H05K 13/08
USPC .......... 156/64, 356, 366, 367, 368, 378, 379
See application file for complete search history.

(56) References Cited

U.S. PATENT DOCUMENTS

2006/0111222 A1* 5/2006 Yasui ................ H05K 13/0408
483/1

FOREIGN PATENT DOCUMENTS

| JP | 2-303570 A | | 12/1990 |
|---|---|---|---|
| JP | 06262115 A | * | 9/1994 |
| JP | 2008-311476 A | | 12/2008 |

OTHER PUBLICATIONS

Translation of JP 02-303570A, Dec. 17, 1990, Japan, Inventor Kanazawa Tsuneo, Sanyo Electri Co Ltd.*

(Continued)

*Primary Examiner* — George Koch
(74) *Attorney, Agent, or Firm* — Oblon, McClelland, Maier & Neustadt, L.L.P.

(57) ABSTRACT

In a component mounting device, a head held by a head holding section is automatically exchanged from one of a pickup head attached with a suction nozzle that holds and releases component, and a dispensing head with a dispensing tool that dispenses adhesive, to the other of the heads. When the pickup head is held, a nozzle camera images the suction nozzles at nozzle positions attached to the pickup head from the side using an optical system unit and acquires suction nozzle image data. When the dispensing head is held, the nozzle camera images a dispensing nozzle positioned at the center axis of the head holding body from the side using the optical system unit and acquires dispensing nozzle image data. Component related inspection is performed based on the suction nozzle image data and dispensing related inspection is performed based on the dispensing nozzle image data.

6 Claims, 6 Drawing Sheets

(56) References Cited

OTHER PUBLICATIONS

Translation of JP JP 06-262115 A, Sep. 1994, Japan, Inventor Naito, Toshinobu, Sony Corp.*
International Search Report Issued Jan. 28, 2014 in PCT/JP13/080437 Filed Nov. 11, 2013.

* cited by examiner

COMPONENT MOUNTING DEVICE

This application is a 371 of PCT/JP2013/080437, filed on Nov. 11, 2013.

TECHNICAL FIELD

The present disclosure relates to a component mounting device.

BACKGROUND ART

Component mounting devices that perform mounting of a held component on a board are known. With this type of component mounting device, it is known to image a suction nozzle and perform inspection of the suction nozzle or inspection of the component held on the suction nozzle (for example, patent literature 1). With patent literature 1, the suction nozzle is imaged from the side, and based on the captured image judgment is performed as to whether a component pickup error (the pickup position is deviated with respect to the suction nozzle) or a component mounting error (the component remained on the suction nozzle after mounting operation) occurred.

Also known are applying devices that apply a material such as adhesive or solder paste onto a board. With this type of applying device, it is known to image the nozzle that dispenses material from the side, and to perform inspection as to whether dispensing has been performed correctly (for example, patent literature 2). With patent literature 2, the nozzle tip is imaged from the side after applying the material onto the board, and judgment is performed as to whether the amount of adhesive remaining on the nozzle tip is equal to or less than a set remaining amount, and if the amount of adhesive remaining on the nozzle tip is equal to or less than the set remaining amount, it is judged that dispensing of the material has been performed correctly.

CITATION LIST

Patent Literature

Patent Literature 1: JP-A-2008-311476
Patent Literature 2: JP-A-2-303570

SUMMARY

However, there is a demand for component mounting devices to be equipped with a component holding tool that holds a component and a dispensing tool that dispenses a viscous fluid. In this case, it could be considered to perform inspection of components using the device configuration disclosed in patent literature 1, and perform inspection of dispensing using the device configuration disclosed in patent literature 2. However, in this case, the component mounting device must be provided with a mechanism that images the component holding tool from the side and a mechanism that images the dispensing tool from the side, meaning that the quantity of members configuring the component mounting device increases, which is undesirable.

The present disclosure takes account of the above circumstances, and an object thereof is to perform component related inspection and dispensing related inspection with a simpler configuration.

According to an aspect of the present disclosure, a component mounting device that performs applying of a viscous fluid to a board and mounting of a held component to a board includes:

a storing device that stores at least one head of multiple types of heads that include a mounting head with a component holding tool that holds and releases a component, and a dispensing head with a dispensing tool that dispenses viscous fluid from a dispensing outlet;

a head holding device that exchangeably holds the heads;

a head moving device that moves the head holding device;

a head exchange control device that exchanges one of the mounting head and the dispensing head being held on the head holding device for the other of the mounting head and the dispensing head by controlling the head moving device and exchanging the head being held on the head holding device for the head stored in the head storage device;

an imaging device that, in a case in which the head holding device is holding the mounting head, images the component holding tool of the mounting head from the side and acquires component holding tool image data, and in a case in which the head holding device is holding the dispensing head, images the dispensing tool of the dispensing head from the side and acquires dispensing image data; and an inspection device that performs component related inspection of at least one of the component holding tool and the component held by the component holding tool based on the component holding tool image data, and that performs dispensing related inspection of at least one of the dispensing tool and the viscous fluid dispensed from the dispensing outlet of the dispensing tool based on the dispensing image data.

The present disclosure of a component mounting device, by moving the head holding device and exchanging the head held by the head holding device with a head stored in the storage device, is capable of exchanging one of a mounting head with a component holding tool capable of holding and releasing a component, and a dispensing head with a dispensing tool capable of dispensing viscous fluid from a dispensing outlet, with the other of the mounting head and the dispensing head. Also, the imaging device, when the mounting head is held by the head holding device, images the component holding tool of the mounting head from the side and acquires component holding tool image data, and when the dispensing head is held by the head holding device, images the dispensing tool of the dispensing head from the side and acquires dispensing tool imaging data. Then, component related inspection of at least one of the component holding tool and the component held by the component holding tool is performed based on the component holding tool image data, and dispensing related inspection of at least one of the dispensing tool and the viscous fluid dispensed from the dispensing outlet of the dispensing tool is performed based on the dispensing tool image data. In this way, the present disclosure of a component mounting device is capable of exchanging the head held by the head holding device to and from a mounting head and a dispensing head, and the mechanism that images the component holding tool of the mounting head and the mechanism that images the dispensing tool of the dispensing head are the same imaging device. Thus, component holding tool image data and dispensing tool image data are acquired with a simpler configuration, and component related inspection and dispensing related inspection are performed with a simpler configuration. Here, "viscous fluid" includes adhesive, solder, and brazing material and the like.

According to another aspect of the disclosure, the inspection device may perform the dispensing related inspection that includes at least one of application good/bad inspection that judges whether application is good/bad by detecting viscous fluid on the dispensing outlet based on the dispensing tool image data imaged after viscous fluid has been applied on the board from the dispensing tool, dripping inspection that judges whether viscous fluid is dripping from the dispensing outlet based on the dispensing tool image data imaged when viscous fluid is not being applied to the board, and dispensing tool inspection that judges whether the type of dispensing tool used by the dispensing head is correct based on the dispensing tool image data.

According to another aspect of the disclosure, the component holding tool may be detachable from the mounting head; the imaging device may include a first optical system that is adjusted such that, when the dispensing head is held by the head holding device, the dispensing tool of the held dispensing head is in focus, and, when the mounting head is held by the head holding device, the component holding tool attached to the held mounting head is in the field of view; and the inspection device may perform the dispensing related inspection based on the dispensing tool image data imaged by the imaging device using the first optical system, and perform component related inspection that includes attachment inspection which inspects whether the component holding tool is attached to the mounting head based on the component holding tool image data imaged by the imaging device using the first optical system. In this way, because the first optical system is adjusted such that the dispensing tool is in focus, dispensing related inspection is performed more appropriately. Also, because the first optical system is adjusted such that component holding tool is also in the field of view, it can also be used for attachment inspection. That is, the first optical system is used for both dispensing related inspection and attachment inspection.

According to another aspect of the disclosure, the imaging device may include a first optical system adjusted such that, when the dispensing head is held by the head holding device, the dispensing tool of the held dispensing head is in focus, and a second optical system adjusted such that, when the mounting head is held by the head holding device, the component mounting tool of the held mounting head is in focus; and the inspection device may perform the dispensing related inspection based on the dispensing tool image data imaged by the imaging device using the first optical system, and perform component related inspection based on the component holding tool image data imaged by the imaging device using the second optical system. In this way, because the first optical system is adjusted such that the dispensing tool is in focus and the second optical system is adjusted such that the component holding tool is in focus, dispensing related inspection and component related inspection can both be performed more appropriately. Note that, the first optical system is not limited to use for imaging of a component holding tool in focus, the first optical system may also have a shared use for imaging other target objects which are not in focus. In a similar way, the second optical system may also have a shared use for imaging other target objects which are not in focus.

According to another aspect of the disclosure, multiple holding tools may be attachable/detachable to/from the mounting head; the imaging device may include a first optical system that is adjusted such that, when the dispensing head is held by the head holding device, the dispensing tool of the held dispensing head is in focus, and, when the mounting head is held by the head holding device, the component holding tool attached to a first position of the held mounting head is in the field of view, and a second optical system adjusted such that, when the mounting head is held by the head holding device, the component mounting tool positioned at a second position different to the first position of the held mounting head, is in focus; and the inspection device may perform the dispensing related inspection based on the dispensing tool image data imaged by the imaging device using the first optical system, perform the component related inspection including attachment inspection that inspects whether the component holding tool is attached to the first position based on the component holding tool image data imaged by the imaging device using the first optical system, and perform inspection related to a component held by the component holding tool positioned at the second position based on the component holding tool image data imaged by the imaging device using the second optical system. In this way, because the first optical system is adjusted such that the dispensing tool is in focus, dispensing related inspection is performed more appropriately. Further, because the first optical system is adjusted such that component holding tool is also in the field of view, it can also be used for attachment inspection. That is, the first optical system is used for both dispensing related inspection and attachment inspection. Also, because the second optical system is adjusted such that the component holding tool is in focus, inspection related to a component held by the component holding tool is performed more appropriately using the second optical system.

According to another aspect of the disclosure, the imaging device may be provided as one unit with the head holding device. In this way, it is easier to appropriately maintain the positional relationship between the head held by the head holding device and the imaging device during imaging, such that it is easier to acquire appropriate component holding tool image data and dispensing tool image data. In this case, the component mounting device of the present disclosure may be provided with a relative position changing device that moves at least one of the imaging device and the head held by the head holding device so as to change the relative position of the imaging device and the head. In this way, for example, by changing the positional relationship of the imaging device and the head held by the head holding device during imaging by the imaging device during application of a viscous fluid or mounting of a component, a more appropriate positional relationship can be maintained based on the condition of the imaging device and the head.

BRIEF DESCRIPTION OF DRAWINGS

FIG. 6 is a conceptual diagram showing the positional relationship between suction nozzle 13 of pickup head 120 held by head holding body 21 and optical system unit 80.

DESCRIPTION OF EMBODIMENTS

Figure 1:
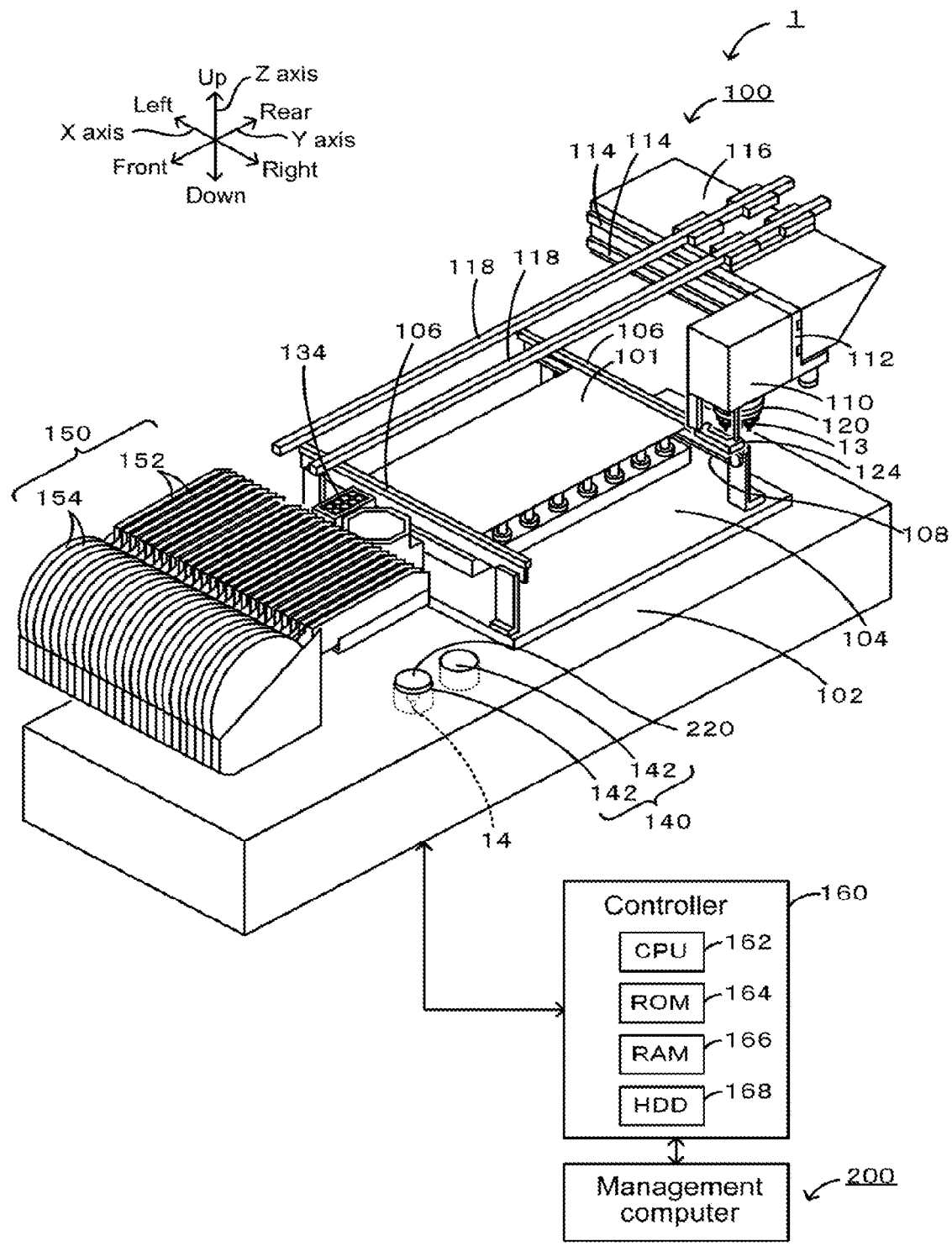
FIG. 1 shows the overall configuration of component mounting system 1.

Hereinafter, an embodiment of the present disclosure will be described with reference to the figures. FIG. 1 shows the overall configuration of component mounting system 1. In the present embodiment, left-right directions (X axis), front-rear directions (Y axis), and up-down directions (Z axis) are set as shown in FIG. 1.

Configuration of Component Mounting System 1

Component mounting system 1 is provided with component mounting device 100 and management computer 200.

As shown in FIG. 1, component mounting device 100 is provided with board conveyance device 104 mounted on base 102, head unit 110 that is capable of movement in an XY plane, pickup head 120 that is detachably attached to head unit 110, nozzle camera 124 that images a nozzle such as suction nozzle 13 from the side (front), head storage area 140 for storing each type of head, component supply device 150 that supplies components to be mounted to board 101, and controller 160 that performs various types of control.

Board conveyance device 104 conveys board 101 from left to right using conveyor belts 108 and 108 (only one of these is shown in FIG. 1) that are respectively attached to a pair of front/rear supporting plates 106 and 106.

Head unit 110 is attached to X-axis slider 112 and moves in a left-right direction with the left-right direction movement of X-axis slider 112 along guide rails 114 and 114, and moves in a front-rear direction with the front-rear movement of Y-axis slider 116 along guide rails 118 and 118. This allows head unit 110 to move in an XY plane. Sliders 112 and 116 are each driven by a servo motor that is not shown in the figures.

Pickup head 120 is detachably attached to head unit 110. Suction nozzle 13 uses pressure to pick up and release a component at the nozzle tip. Twelve suction nozzles 13 are attached to pickup head 120.

Head storage area 140 is provided on the right side on an upper surface of base 102, and is provided with multiple storage locations 142 for storing pickup head 120 and dispensing head 220. A dispensing head 220 is being stored in the storage location 142 at the front; the storage location 142 at the rear is empty.

Dispensing head 220 is detachably attached to head unit 110. One dispensing nozzle 14 is attached to dispensing head 220. Dispensing nozzle 14 is for dispensing adhesive used for attaching a component to board 101 from the outlet at the nozzle tip using pressure.

Component supply device 150 is attached to the front of component mounting device 100. Component supply device 150 has multiple slots and a feeder 152 can be inserted into each slot. Reel 154 around which tape is wound is attached to feeder 152. Components are held in the surface of the tape lined up in the lengthwise direction of the tape. The components are protected by a film that covers the surface of the tape. This tape is indexed to the rear by a sprocket mechanism which is not shown and the film is peeled off, such that the components are arranged at a predetermined position in an exposed state. The predetermined position is a position at which the component can be picked up by suction nozzle 13. A suction nozzle 13 that has picked up a component at this predetermined position is capable of mounting that component at a specified position on board 101.

Component mounting device 100 is also provided with nozzle stocker 134 and so on. Nozzle stocker 134 is a box that stocks multiple types of suction nozzles 13 and multiple types of dispensing nozzles 14, and is provided next to component supply device 150. Suction nozzles 13 are exchanged as appropriate for the type of component and type of board on which the component is to be mounted. Dispensing nozzles 14 are exchanged based on the nozzle with a diameter appropriate for the amount of adhesive to be dispensed (the diameter of the adhesive deposit to be applied to board 101).

Controller 160 is provided with CPU 162 that performs various types of control, ROM 164 that memorizes control programs and so on, RAM 166 used as working memory, and HDD 168 that memorizes large amounts of data, and these are connected by a bus which is not shown. Controller 160 is connected to board conveyance device 104, X-axis slider 112, Y-axis slider 116, and head unit 110 so as to be capable of exchanging signals with those items.

Management computer 200 manages the production job of board 101, and memorizes production job data created by an operator. Defined in the production job data is which components from feeders at which slot positions are to be mounted to which type of board 101 and in what order at component mounting device 100, and also how many of those boards 101 are to be manufactured and so on. Also defined in production job data is how much adhesive for attaching each mounted component to board 101 is to be applied, and at which positions on board 101 and in what order, and so on. Management computer 200 is connected to controller 160 of component mounter 100 such that two-way communication is possible.

Figure 2:
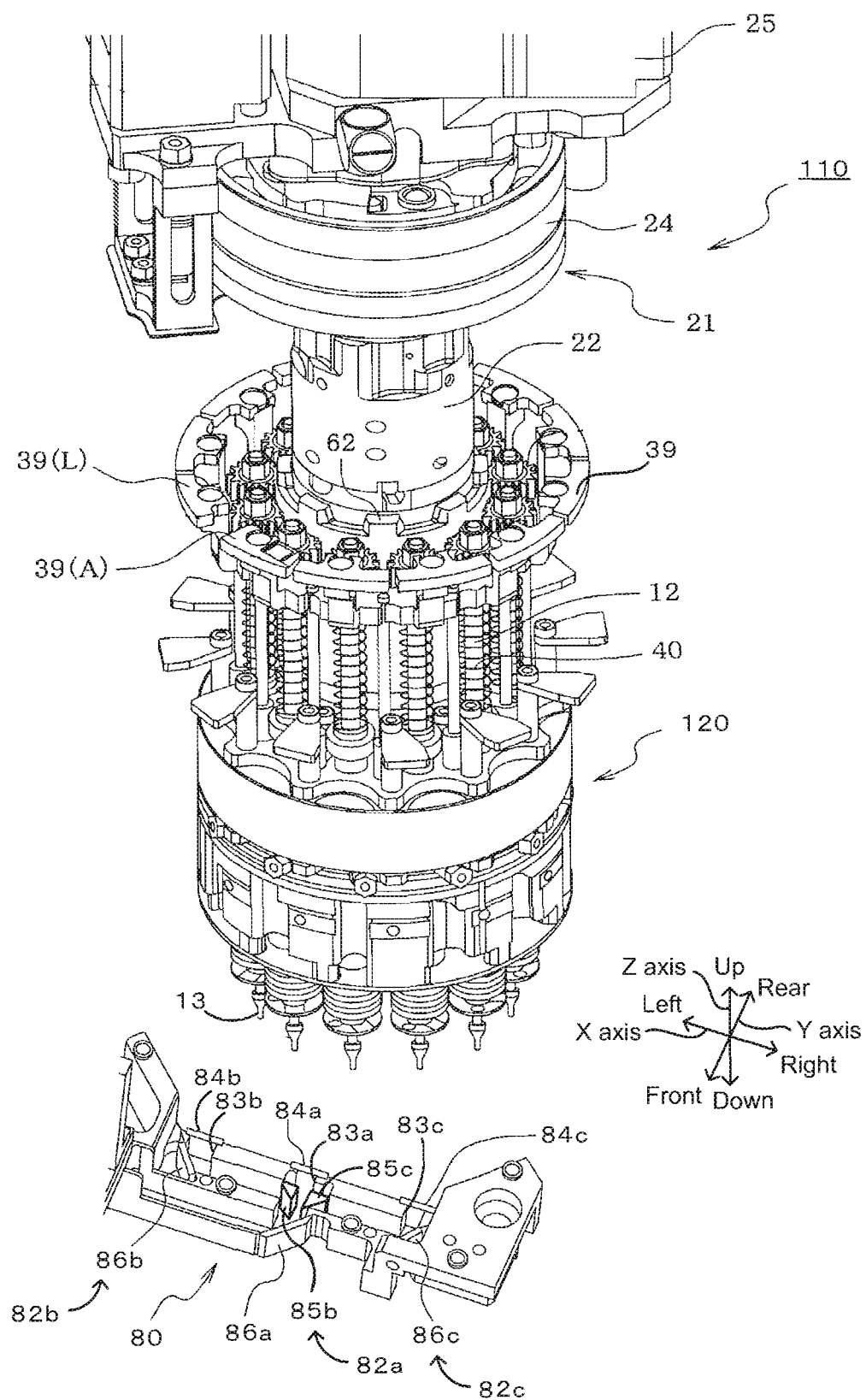
FIG. 2 is a perspective view of head unit 110.
Figure 3:
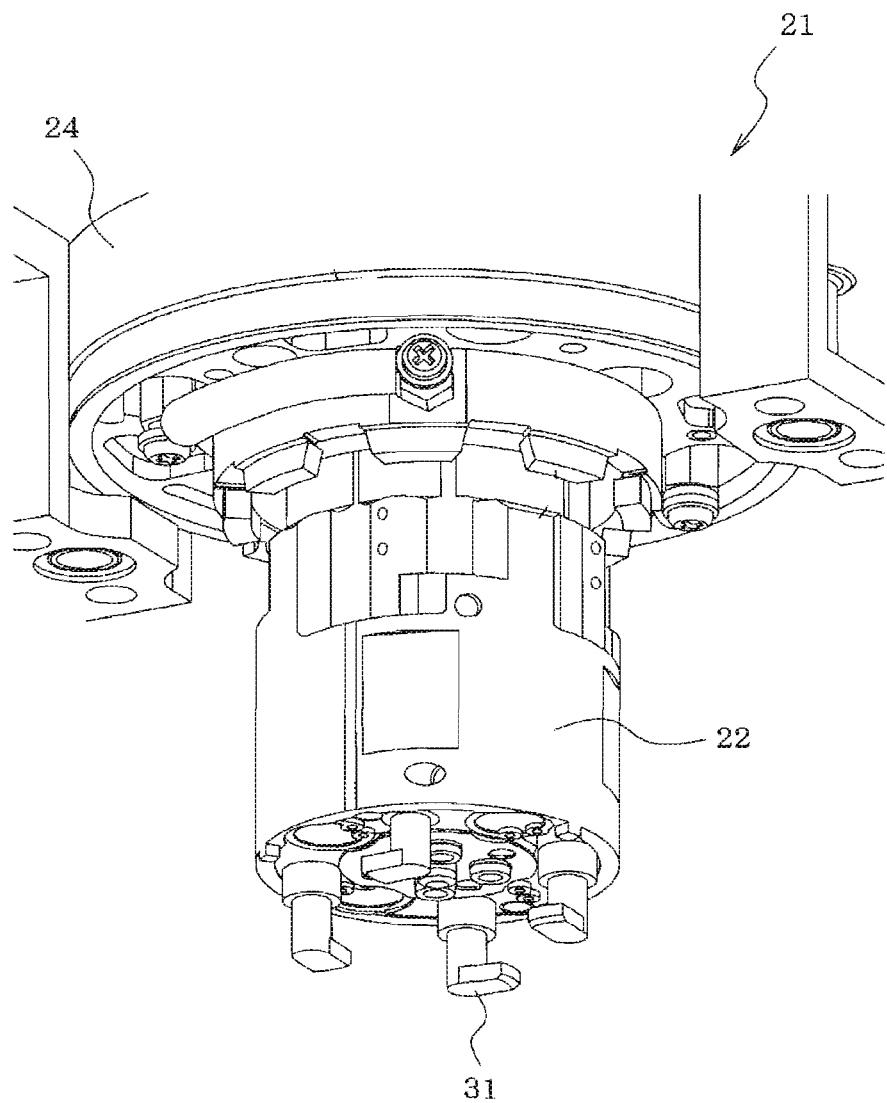
FIG. 3 is a perspective view of head holding body 21 seen from below looking up diagonally.
Figure 4:
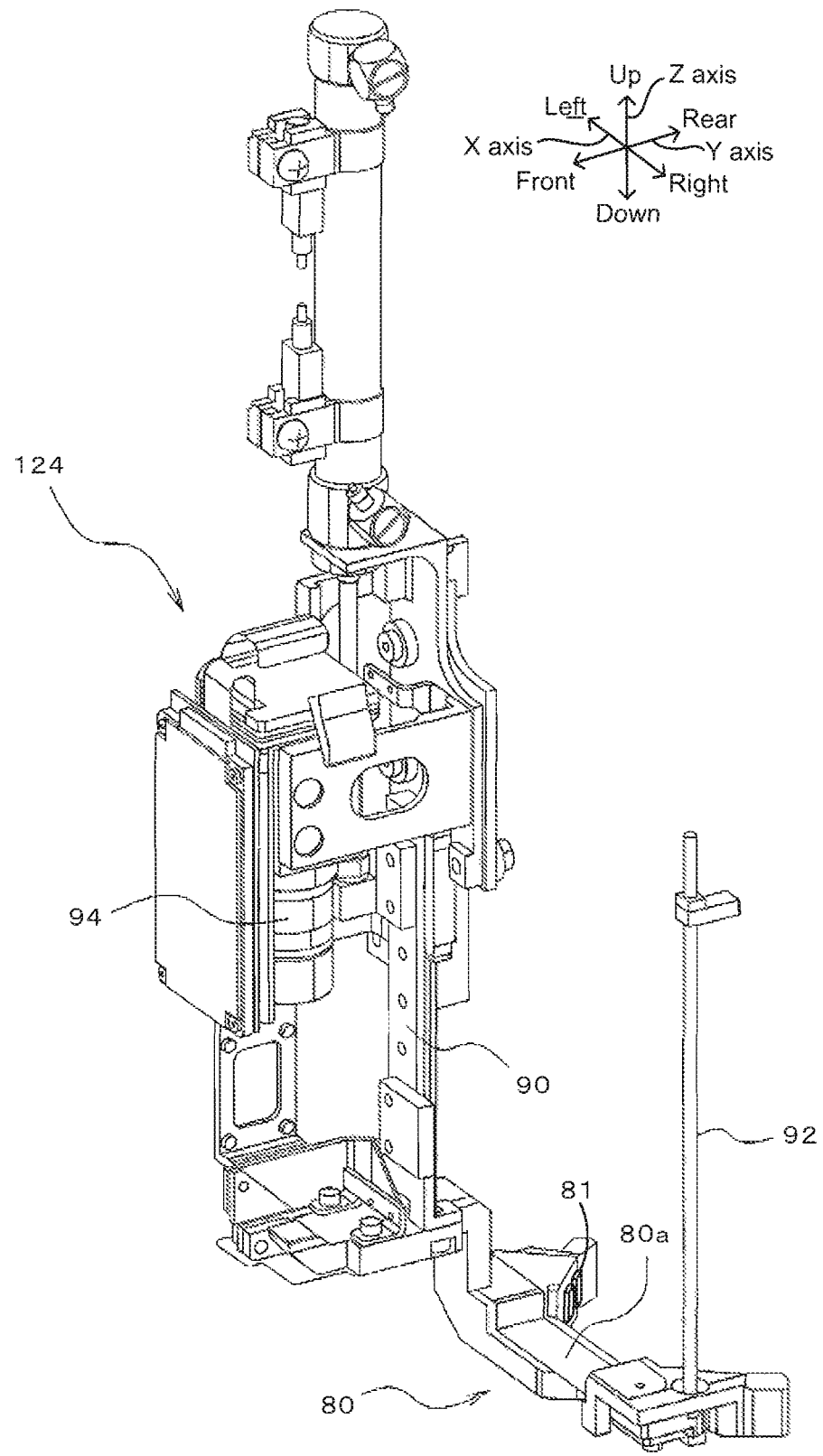
FIG. 4 is a perspective view of nozzle camera 124.

Head unit 110 is described in detail below. FIG. 2 is a perspective view of head unit 110 with the covers removed, specifically, a perspective view with pickup head 120 lowered with respect to R axis 22 of head holding body 21. FIG. 3 is a perspective view of head holding body 21 seen from below looking up diagonally; FIG. 4 is a perspective view of pickup head 120 seen from above looking down diagonally. FIG. 4 is a perspective view of nozzle camera 124.

Head unit 110 is provided with head holding body 21, pickup head 120, and nozzle camera 124.

Head holding body 21 is attached to X-axis slider 112 (refer to FIG. 1) to be capable of being raised/lowered by a raising/lowering mechanism which is not shown. Head holding body 21 has ring-shaped R-axis gear 24 on the upper portion and cylindrical R-axis 22 on the lower portion. R-axis gear 24 is driven by R-axis motor 25 and rotates as one with R axis 22. R axis 22 has multiple (four in the present embodiment) engaging members 31 with a hook on the lower end. The direction of the hook is arranged to be the same as the forward rotation direction of R axis 22. These engaging members 31 are arranged at even intervals on the same circular circumference on the lower surface of R axis 22 (the center of the circumference matches the center axis of R axis 22). Also, each engaging member 31 is capable of up/down movement by an air cylinder which is not shown.

Pickup head 120 is a member with an approximately cylindrical exterior, and multiple (twelve in the present embodiment) suction nozzles 13 are on the bottom of pickup head 120. Suction nozzle 13 is formed as one unit with nozzle holder 12, which is provided in a vertical orientation. Nozzle holder 12 has nozzle operation lever 39 near the top end, and is biased upwards by spring 40 such as to be positioned at a specified set position (up position). Nozzle operation levers 39 are provided from first nozzle operation lever 39 (A) to last (twelfth) nozzle operation lever 39 (L) in order of suction nozzles 13 to be operated. When looking from above in FIG. 2, this order is counterclockwise from the first to the last. When nozzle operation lever 39 is pressed, nozzle holder 12 and suction nozzle 13 are lowered against the elastic force of spring 40; when nozzle operation lever 39 is released, nozzle holder 12 and suction nozzle 13 return to the set position by the elastic force of spring 40. Note that, head holding body 21 includes a nozzle operation lever pressing section, not shown, that presses nozzle operation lever 39 in a downward direction. This nozzle operation lever pressing section is attached to a first Z-axis slider, not shown, and moves up/down by the driving of the first Z-axis slider by a servo motor, also not shown. The pressing and releasing of nozzle operation lever 39 is performed by the up/down movement of this nozzle operation lever pressing section.

Figure 6:
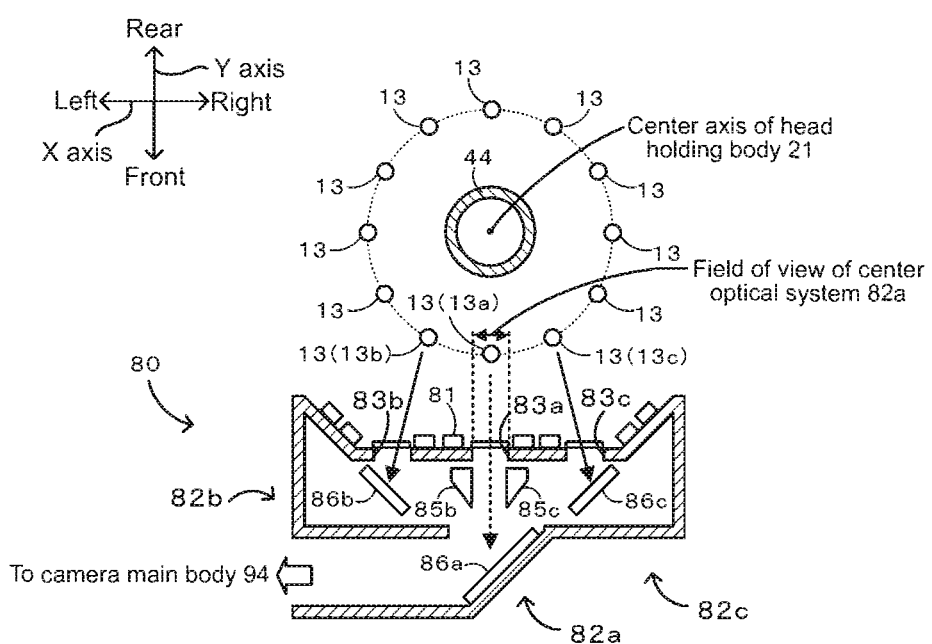
FIG. 6 is a perspective view of dispensing head 220.

Also, pickup head 120 has cylindrical background body 44 that protrudes from the bottom section in the downwards direction of FIG. 2 (refer to FIG. 6, which is described later). The center axis of background body 44 matches the center axis of R axis 22 and the center axis of the circumference on which the twelve suction nozzles 13 are lined up. A fluorescent material, for example, is coated on the outer circumferential surface of background body 44, and the fluorescent material can emit light by receiving ultra-violet rays from light source 81 (refer to FIG. 4) of nozzle camera 124.

Further, pickup head 120 has a hollow cylindrical space into which R axis 22 can be inserted. Multiple (four in this embodiment) engaging holes are formed in the disk-shaped base, not shown, inside this hollow cylindrical space. Head holding body 21 is configured to be able to hold pickup head 120 by these engaging holes being engaged by the hooks of engaging members 31 of R axis 22.

Nozzle camera 124 is attached to head unit 110. As shown in FIG. 4, nozzle camera 124 is provided with main body frame 90, support shaft 92, camera main body 94, and optical system unit 80. Main body frame 90 and support shaft 92 are attached to head unit 110 to be one unit with head holding body 21. Thus, nozzle camera 124 is moved in the XY direction in accordance with the movement in the XY direction of head unit 110 (head holding body 21). Note that, the raising/lowering of head holding body 21 is independent to nozzle camera 124, thus the positional relationship in the vertical direction between the head (pickup head 120 or dispensing head 220) held by the head holding body 21 and optical system unit 80 of nozzle camera 124 can be adjusted. Camera main body 94 is attached to main body frame 90 and is provided with a lens, image sensor, image processing section, and so on, which are not shown. Optical system unit 80 is attached to main body frame 90 and support shaft 92. Multiple light sources 81 are attached to the rear surface of optical system unit 80.

The internal configuration of optical system unit 80 is described below. FIG. 2 shows a view with upper cover 80a of optical system unit 80 of FIG. 4 removed. As shown in FIG. 2, optical system unit 80 is provided with center incidence opening 83a, left incidence opening 83b, and right incidence opening 83c, which are opened towards the rear (the direction towards where the head attached to head holding body 21 is positioned), and transparent center cover 84a, left cover 84b, and right cover 84c that respectively cover incidence openings 83a to 83c. Also, optical system unit 80 is provided with center optical system 82a, left optical system 82b, and right optical system 82c that guide light inputted from center incidence opening 83a, left incidence opening 83b, and right incidence opening 83c to the image sensor of camera main body 94. Center optical system 82a includes mirror 86a or the like. Light inputted from center incidence opening 83a is guided to camera main body 94 via mirror 86a. Left optical system 82b includes mirror 86b, prism 85b, mirror 86a (shared with center optical system 82a), or the like. Light inputted from left incidence opening 83b is guided to camera main body 94 by reflection from and passing through mirror 86b, prism 85b, and mirror 86a in that order. Right optical system 82c includes mirror 86c, prism 85c, mirror 86a (shared with center optical system 82a), or the like. Light inputted from right incidence opening 83c is guided to camera main body 94 by reflection from and passing through mirror 86c, prism 85c, and mirror 86a in that order. Note that, a gap is formed in the left/right direction between prism 85b and prism 85c, and light from center incidence opening 83a passes through this gap to arrive to mirror 86a. An electric charge occurs in the image sensor of camera main body 94 due to receiving light from center optical system 82a, left optical system 82b, and right optical system 82c. The image processing section of camera main body 94 inputs the electric charge that occurred at the image sensor and creates image data based on this electric charge.

Figure 5:
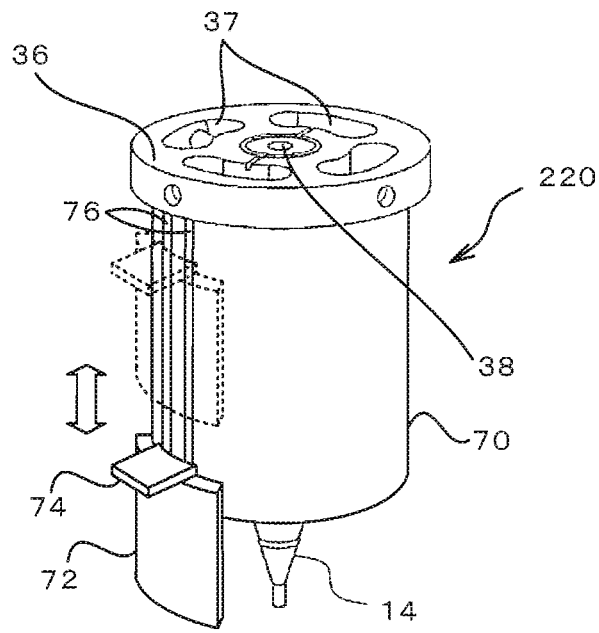

Next, dispensing head 220 is described. FIG. 5 is a perspective view of dispensing head 220. Dispensing head 220 shown in FIG. 5 is stored in head storage area 140 (refer to FIG. 1). Dispensing head 220 is provided with cylindrical main body section 70 that includes a housing chamber which houses adhesive in an internal section, and base 36 attached to the upper section of main body 70 as shown in FIG. 5. Main body 70 is provided with one dispensing nozzle 14 on the lower section as shown in FIG. 5. Base 36 is provided with multiple engaging holes 37. Also, pressure supply opening 38 that is a vertical hole in base 36 is formed in the center of base 36. Positive pressure and negative pressure can be supplied to head holding body 21 via pressure supply opening 38. Also, pressure supply opening 38 and the housing chamber of main body 70 and dispensing nozzle 14 are connected. Therefore, when positive pressure is supplied to pressure supply opening 38, adhesive in the housing chamber of main body 70 is dispensed from the dispensing outlet of dispensing nozzle 14 by this pressure. Also, when negative pressure is supplied to pressure supply opening 38, adhesive at the dispensing outlet of dispensing nozzle 14 is pulled to the housing chamber side, so as to control the dispensing of adhesive from dispensing nozzle 14. Note that, the base and engaging holes, not shown, of the above described pickup head 120 are formed similarly to base 26 and engaging holes 37 of dispensing head 220.

Also, curved background plate 72 is attached to main body section 70 of dispensing head 220 along the outer circumferential surface of main body section 70. A fluorescent material, for example, is coated on the inner circumferential surface of background plate 72 (the surface on the dispensing nozzle 14 side), and the fluorescent material can emit light by receiving ultra-violet rays from light source 81 of nozzle camera 124. This background plate 72 is attached to guide grooves 76 and 76 formed in an axial direction (the up/down direction in FIG. 5) on the outer circumferential surface of main body section 70 by a protruding section, which is not shown. Thus, background plate 72 is movable in an axis direction along guide grooves 76 and 76. Also, background plate 72 includes background plate operation lever 74 on the upper end, and is biased upwards by a spring, not shown, inside guide grooves 76 and 76 so as to be positioned at a predetermined position (the position shown by the dashed lines in FIG. 5). When background plate operation lever 74 is pressed, background plate 72 is lowered to a position (the position shown by the solid lines in FIG. 5) facing dispensing nozzle 14 against the elastic force of the spring. Also, when the pressing of background plate operation lever 74 is released, background plate 72 returns to its original position by the elastic force of the spring. Note that, head holding body 21 includes a background plate operation lever pressing section, not shown, that presses background plate operation lever 74 downwards. This background plate operation lever pressing section is attached to a second Z-axis slider, not shown, and moves up/down based on the driving of the second Z-axis slider by a servo motor, also not shown. The pressing and releasing of background plate operation lever 74 is performed by the up/down movement of this background plate operation lever pressing section.

Figure 7:
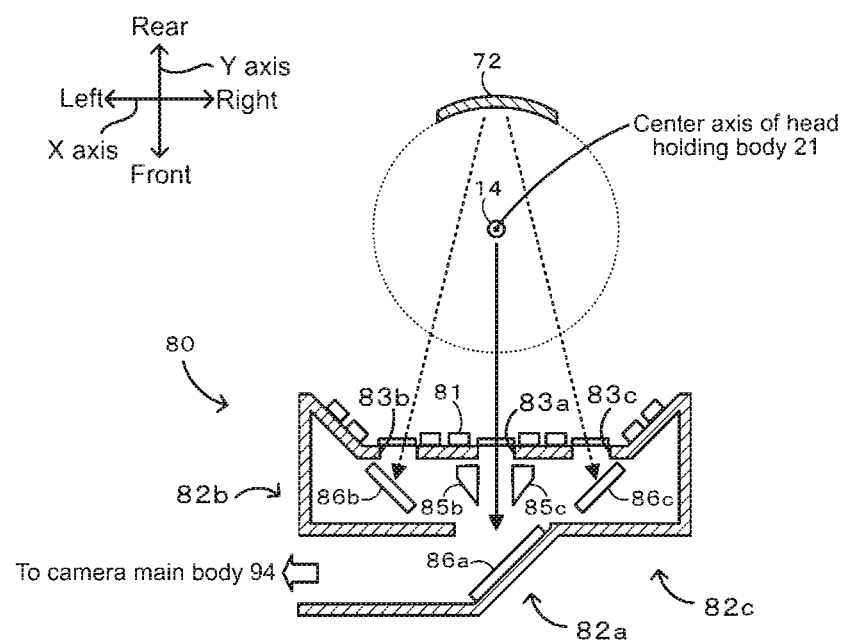
FIG. 7 is a conceptual diagram showing the positional relationship between dispensing nozzle 14 of dispensing head 220 held by head holding body 21 and optical system unit 80.

Described next is the positional relationship between optical system unit 80 of nozzle camera 124 and the nozzle of each head. FIG. 6 is a conceptual diagram showing the positional relationship between suction nozzle 13 of pickup head 120 held by head holding body 21 and optical system unit 80. FIG. 7 is a conceptual diagram showing the positional relationship between dispensing nozzle 14 of dispensing head 220 held by head holding body 21 and optical system unit 80. FIGS. 6 and 7 show a cross section perpendicular to the Z axis. Also, FIGS. 6 and 7 show a state with head holding body 21 raised/lowered to be positioned at a height position (imaging position) at which each of suction nozzle 13 and dispensing nozzle 14 face optical system unit 80 such that imaging of each nozzle is possible by nozzle camera 124.

In the present embodiment, the focus of center optical system 82a is adjusted to match the center axis of head holding body 21 (=the center axis of the held pickup head 120). Therefore, as shown in FIG. 6, when pickup head 120 is held on head holding body 21, the position (hereinafter this position is referred to as nozzle position 13a) of the lowest nozzle 13 positioned at the front surface (behind) center incidence opening 83a from among the twelve suction nozzles 13 of pickup head 120 is included within the field of vision of center optical system 82a. By this, even though the focus does not match, nozzle camera 124 is able to image suction nozzle 13 (and a component held by that suction nozzle 13) at nozzle position 13a via center optical system 82a. Also, the focus of left incidence opening 83b and right incidence opening 83c are respectively adjusted to match the position of suction nozzle 13 adjacent on the left and right sides of nozzle position 13a (hereinafter these positions are respectively referred to as nozzle position 13b and nozzle position 13c). By this, nozzle camera 124 is able to image suction nozzle 13 (and a component held by that suction nozzle 13) at nozzle position 13b in a focused state via left optical system 82b, and is able to image suction nozzle 13 (and a component held by that suction nozzle 13) at nozzle position 13c in a focused state via right optical system 82c. Note that, in the present embodiment, center optical system 82a, left optical system 82b, and right optical system 82c share mirror 86a, thus light inputted via center optical system 82a, left optical system 82b, and right optical system 82c is received by image sensor of camera main body 94 all together. By this, nozzle camera 124 acquires image data that shows one image in which images of the center, left side, and right side are arranged based respectively on light received via center optical system 82a, left optical system 82b, and right optical system 82c. Accordingly, when imaging is performed in the state shown in FIG. 6, one item of image data (hereinafter referred to as suction nozzle image data), in which the image of suction nozzle 13 in nozzle position 13a, which is not in focus, is arranged in the center, suction nozzle 13 at nozzle position 13b, which is in focus, is arranged on the left side, and suction nozzle 13 at nozzle position 13c, which is in focus, is arranged on the right side, is acquired. Note that, by having background body 44 positioned behind nozzle positions 13a to 13c, and adjusting the field of view of center optical system 82a, left optical system 82b, and right optical system 82c, suction nozzles 13 at positions other than nozzle positions 13a to 13c are not captured in the suction nozzle image data. Also, by rotating the R axis using the R-axis motor, the twelve suction nozzles 13 are rotated around the center axis of head holding body 21. Accordingly, it is possible to image any three suction nozzles 13 that are consecutive in a circular circumferential direction out of the twelve suction nozzles 13.

On the other hand, as shown in FIG. 7, when dispensing head 220 is held on head holding body 21, dispensing nozzle 14 is positioned near the center axis of dispensing head 220. Accordingly, nozzle camera 124 is able to image dispensing nozzle 14 (and adhesive at the dispensing opening of dispensing nozzle 14) in focus via center optical system 82a. Note that, by having background body 44 positioned behind dispensing nozzle 14, only background plate 72 is included in the field of vision of left center optical system 82b and right center optical system 82c. Accordingly, when imaging is performed in the state shown in FIG. 7, image data (hereinafter referred to as dispensing nozzle image data) in which an image of dispensing nozzle 14 in focus is arranged in the center is acquired.

Note that, nozzle camera 124 shines ultra-violet rays on background body 44 and background plate 72 using light source 81, and performs imaging using the light emitted from background body 44 and background plate 72. By this, in suction nozzle image data, the background body 44 portion becomes a bright background, and the imaging targets such as suction nozzles 13 in nozzle positions 13a to 13c display dark. Similarly, in dispensing nozzle image data, the background plate 72 portion becomes a bright background, and the imaging targets such as dispensing nozzle 14 are displayed as dark shapes.

Operation of Component Mounting System 1—Adhesive Application Processing

Described next is the operation in which CPU 162 of controller 160 of component mounting device 100 performs adhesive application processing using head unit 110 based on production job data received from management computer 200. With head holding body 21 holding dispensing head 220, CPU 162 moves head unit 110 based on production job data received from 200, and repeatedly performs adhesive application processing of applying a specified amount of adhesive to a specified position on board 101. In this adhesive application processing, CPU 162 controls the dripping of adhesive from dispensing nozzle 14 during periods when dispensing of adhesive from dispensing nozzle 14 is not performed by supplying negative pressure to pressure supply opening 38. For example, CPU 162 controls dripping from dispensing nozzle 14 until dispensing nozzle 14 moves to the specified position above board 101 at which adhesive is to be applied next. Further, when dispensing nozzle 14 has been moved to the specified position, CPU 162 lowers head holding body 21 such that dispensing nozzle 14 approaches close to board 101, supplies positive pressure to pressure supply opening 38 such that adhesive is dispensed from dispensing nozzle 14, thus performing application of adhesive to the specified position. Also, when starting adhesive application processing, CPU 162 moves dispensing head 220 above the appropriate nozzle stocker 134 and performs changing of dispensing nozzle 14 based on the production job data such that the appropriate type of dispensing nozzle 14 is attached to dispensing head 220. Note that, in adhesive application processing, CPU 162 lowers head holding body 21 to a position lower than the imaging position when applying adhesive and when changing dispensing nozzles 14. Thus, nozzle camera 124 does not obstruct adhesive application processing.

Operation of Component Mounting System 1—Dispensing Related Inspection

During adhesive application processing, CPU 162 performs dispensing related inspection using nozzle camera 124. In the present embodiment, CPU 162 performs dispensing nozzle inspection, dripping inspection, and application good/bad inspection. Dispensing nozzle inspection is inspection that judges whether the type of dispensing nozzle 14 attached to dispensing head 220 is correct, and is performed by CPU 162 directly after changing of dispensing nozzles 14 is performed. In this dispensing nozzle inspection, CPU 162 first raises/lowers head holding body 21 to the imaging position described above. Continuing, CPU 162 lowers background plate 72 and acquires dispensing nozzle image data imaged from the side of dispensing nozzle 14. Next, CPU 162 judges whether the dispensing nozzle 14 that was imaged is an appropriate type based on the dispensing nozzle image data. In the present embodiment, the judgment is performed based on the diameter of the opening of dispensing nozzle 14 (the left-right width in the image data). CPU 162, if the type of dispensing nozzle 14 is not correct, performs changing of dispensing nozzle 14 again and repeats the above imaging and judging. If the type of dispensing nozzle 14 is correct, CPU 162 ends dispensing nozzle inspection.

Described next is dripping inspection. Dripping inspection is inspection that judges whether adhesive is dripping from the dispensing opening of dispensing nozzle 14. This dripping inspection is performed by CPU 162 during periods when adhesive application is not being performed, such as until dispensing nozzle 14 moves to the specified position above board 101 at which adhesive is to be applied next. In this dripping inspection, CPU 162 first, in a similar manner to dispensing nozzle inspection, acquires dispensing nozzle image data. Next, CPU 162 judges whether dripping is occurring from dispensing nozzle 14 based on the dispensing nozzle image data. In the present embodiment, CPU 162 judges whether the size (for example, the length in the up/down direction) of the dark shape (=drop of liquid) that exists below the dispensing opening of dispensing nozzle 14 is equal to or greater than a specified threshold value. Then, if the size is equal to or greater than the specified threshold value, CPU 162 judges that the drop of liquid, which is the adhesive, is a large drop (that is, dripping has occurred, or the possibility of dripping occurring is high), and then stops dripping inspection and adhesive application processing. If adhesive application processing is stopped, for example, CPU 162 reports to an operator that there is liquid dripping via a display or sound and so on, and retracts dispensing head 220 from board 101. The operator who checked the report, after cleaning of the adhesive which dripped on board 101 and dispensing nozzle 14 has been performed, instructs component mounting device 100 to restart adhesive application processing. Conversely, if CPU 162 judges that the size of the drop of liquid is below the specified threshold value, CPU 162 ends dripping inspection as is. Note that, CPU 162 may perform this type of dripping inspection, for example, repeatedly after a specified time has elapsed.

Described next is application good/bad inspection. Application good/bad inspection is inspection that judges whether the application of adhesive to board 101 is good. This application good/bad inspection is performed by CPU 162 directly after negative pressure has been supplied to dispensing nozzle 14 after application of adhesive has been performed to a specified location by dispensing adhesive from dispensing nozzle 14. This dispensing nozzle inspection is performed in a similar way to the above dripping inspection, just at different timing. In cases in which the application of adhesive to board 101 by dispensing nozzle 14 is defective (there is an insufficient quantity of adhesive), in many cases a drop of liquid has occurred at the dispensing opening of dispensing nozzle 14. Therefore, in a similar manner to dripping inspection, CPU 162 judges whether application of adhesive is good/bad by judging whether the size of the drop of liquid that exists below the dispensing opening of dispensing nozzle 14 is equal to or greater than a specified threshold value. Note that, when CPU 162 judges that the application of adhesive is defective, CPU 162 may perform application of adhesive at the specified location again, or CPU 162 may notify an operator of the application defect. Also, the threshold values for dripping inspection and application good/bad inspection may be the same or may be different.

Operation of Component Mounting System 1—Head Automatic Exchange Processing

Described next is the operation in which CPU 162 of controller 160 of component mounting device 100 performs exchange of heads automatically based on production job data received from management computer 200. When performing actions such as one of adhesive application processing and component mounting processing after the other, CPU 162 head automatic exchange processing is performed at specified timing for head automatic exchange based on production job data. In head automatic exchange processing, first, CPU 162 moves head unit 110 directly above an empty storage location 142 in storage area 140, lowers head holding body 21, and stores the head currently held by head holding body 21 in the empty storage location 142. After that, CPU 162, after removing the hooks of engaging members 31 from the engaging holes of the head, raises head holding body 21. Continuing, CPU 162 moves head unit 110 directly above the exchange target head. Then, CPU 162 lowers head holding body 21, and engages engaging members 31 with the engaging holes of the exchange target head to complete head automatic exchange processing. By this, the exchange target head is held by head holding body 21. In this way, CPU 162 performs exchange of one of pickup head 120 and dispensing head 220 for the other.

Operation of Component Mounting System 1—Component Mounting Processing

Described next is the operation in which CPU 162 of controller 160 of component mounting device 100 performs component mounting processing of mounting components to board 101 using head unit 110 based on production job data received from management computer 200. Pickup head 120 is attached to head unit 110. In component mounting processing, first, CPU 162 picks up a component using suction nozzle 13 of pickup head 120. Specifically, first, CPU 162 moves head unit 110 in the XY direction, and moves the first suction nozzle 13 to the specified position at which to pick up a component. Continuing, CPU 162, together with lowering head holding body 21, presses nozzle operation lever 39 so as to lower the first suction nozzle 13, and supplies negative pressure to the tip of suction nozzle 13 so as to pick up the component. Next, the pressing of nozzle operation lever 39 is released such that the first suction nozzle 13 is raised. For the second and on suction nozzles 13, by repeating a similar operation, all of suction nozzles 13 for the first to the final one are made to pick up components. When component pickup is complete, CPU 162 moves head unit 110 in the XY direction such that the suction nozzle 13 holding the component to be mounted is above the mounting position for the component. Then, CPU 162, together with lowering head holding body 21, presses nozzle operation lever 39 such that suction nozzle 13 is lowered, and turns off the negative pressure supplied to suction nozzle 13 so as to mount the component on board 101. After that, suction nozzle 13 is raised. CPU 162 repeatedly performs the above operations to mount one component on board 101 so as to mount all of the components picked up by suctions nozzles 13 of pickup head 120 on board 101. Also, CPU 162 repeatedly performs this type of component mounting processing in which component pickup and mounting onto board 101 are performed. When starting component mounting processing, CPU 162 moves pickup head 120 above the appropriate nozzle stocker 134 and performs changing of suction nozzle 13 based on the production job data such that the appropriate type of suction nozzle 13 is attached to pickup head 120. CPU 162, in a similar manner to component pickup, presses nozzle operation levers 39 one by one such that suction nozzles 13 are lowered one by one, thus performing changing of suction nozzles 13. Note that, CPU 162, when picking up a component using suction nozzle 13, when mounting a component onto board 101, and when changing suction nozzles 13, lowers suction nozzles 13 using nozzle operation lever 39. Thus, when performing these actions, nozzle camera 124 does not cause obstruction.

Operation of Component Mounting System 1—Component Related Inspection

Also, during component mounting processing, CPU 162 performs component related inspection using nozzle camera 124. In the present embodiment, CPU 162 performs attachment inspection and component pickup state inspection as component related inspection. Attachment inspection judges whether suction nozzle 13 is attached on pickup head 120, and is performed by CPU 162 each time head holding body 21 changes one suction nozzle 13. In this attachment inspection, CPU 162 first raises head holding body 21 to the above imaging position. Continuing, CPU 162 acquires suction nozzle image data captured by nozzle camera 124. Next, CPU 162 judges whether a suction nozzle 13 is attached at nozzle position 13a based on suction nozzle image data. For example, CPU 162 judges whether a suction nozzle 13 is attached to (is present at) nozzle position 13a based on whether a dark shape is present in the center of the suction nozzle image data. Then, CPU 162, if judging that suction nozzle 13 is not attached at nozzle position 13a, determines that the immediately prior changing of suction nozzles 13 failed, performs attachment of suction nozzle 13 from nozzle stocker 134 again, and repeats the above imaging and judging. If judging that suction nozzle 13 is attached at nozzle position 13a, CPU 162 ends attachment inspection. When changing multiple suction nozzles 13, CPU 162 repeatedly performs changing and attachment inspection of one suction nozzle 13.

Described next is component pickup state inspection. Component pickup state inspection judges whether the pickup state of a component held by suction nozzle 13 is good or bad (whether the component is present and whether the orientation of a held component is good or bad). This component pickup state inspection is performed by CPU 162 immediately after a component is picked up for all suction nozzles 13 from the first to the final one. In this component pickup state inspection, CPU 162 first images nozzle positions 13a to 13c and acquires suction nozzle image data. Continuing, CPU 162 judges whether the pickup state of suction nozzle 13 at nozzle positions 13b and 13c is good or bad based on the suction nozzle image data. Specifically, CPU 162 judges whether a component is present at all of the tips of suction nozzles 13 at nozzle positions 13b and 13c based on the size and position and so on of the dark shape of suction nozzle image data; when a component is present at all the tips, CPU 162 judges whether the orientation (angle and so on) of the components is good or bad. If CPU 162 judges that there is a suction nozzle 13 at nozzle positions 13b or 13c at which there is no component, or that there is a nozzle for which the orientation of at least one of the components is bad, CPU 162 performs component pickup again for the target suction nozzle 13, repeats the above imaging and judging. If CPU 162 judges that the pickup state for all the suction nozzles at nozzle positions 13b and 13c is good, CPU 162 rotates R axis 22 to move suction nozzles 13 that have not been inspected to nozzle positions 13b and 13c, and repeats the above imaging and judging. If CPU 162 judges that the pickup state is good for all suction nozzles 13 of pickup head 120, CPU 162 ends component pickup state inspection. Note that, for component pickup state inspection, inspection is not performed of suction nozzle 13 at nozzle position 13a that is not in focus. Thus, in the present embodiment, CPU 162 performs inspection for two suction nozzles 13 each time during component pickup state inspection.

Correspondences between constituent elements of the present embodiment and constituent elements of the disclosure will be clarified here. Suction nozzle 13 of the present embodiment corresponds to the component holding tool of the present disclosure, pickup head 120 corresponds to the mounting head, dispensing nozzle 14 corresponds to the dispensing tool, dispensing head 220 corresponds to the dispensing head, head storage area 140 corresponds to the storage device, head holding body 21 corresponds to the head holding device, X-axis slider 112 and Y-axis slider 116 correspond to the head moving device, CPU 162 corresponds to the head exchange control device and the inspection device, suction nozzle image data corresponds to the component holding tool image data, dispensing nozzle image data corresponds to the dispensing tool image data, and nozzle camera 124 corresponds to the imaging device. Also, center optical system 82a corresponds to the first optical system, and left optical system 82b and right optical system 82c correspond to the second optical system. Further, the raising/lowering mechanism that raises/lowers head holding body 21, and which is not shown, corresponds to the relative position changing device.

According to the above component mounting device 100, by moving head holding body 21 and exchanging the head held by head holding body 21 with a head stored in storage location 142 of head storage area 140, it is possible to exchange one of a pickup head 120 attached to which is suction nozzle 13 that is capable of holding and releasing a component, and a dispensing head 220 attached to which is dispensing tool 14 capable of dispensing adhesive from a dispensing outlet, with the other of the pickup head 120 and dispensing head 220. Also, when pickup head 120 is held on head holding body 21, nozzle camera 124 images suction nozzles 13 (suction nozzles 13 at nozzle positions 13a to 13c) attached to pickup head 120 from the side and acquires suction nozzle image data. When dispensing head 220 is held on head holding body 21, nozzle camera 124 images dispensing nozzles 14 attached to dispensing head 220 from the side and acquires suction nozzle image data. Then, component related inspection is performed based on the suction nozzle image data and dispensing related inspection is performed based on the dispensing nozzle image data. In this way, the present disclosure of component mounting device 100 is capable of exchanging the head held by head holding body 21 to and from pickup head 120 and dispensing head 220, and the mechanism that images suction nozzles 13 of pickup head 120 and the mechanism that images dispensing tool 14 of dispensing head 220 are both nozzle camera 124. Thus, compared to a case in which separate mechanism are provided, suction nozzle image data and dispensing nozzle image data are obtained with a simpler configuration, and component related inspection and dispensing related inspection are performed with a simpler configuration.

Also, CPU 162 performs dispensing related inspection that includes application good/bad inspection that judges whether the application is good/bad by detecting adhesive at the dispensing opening based on the dispensing nozzle image data imaged after adhesive was applied to board 101 from dispensing nozzle 14, dripping inspection that judges whether adhesive is dripping from the dispensing opening based on the dispensing nozzle image data imaged when adhesive is not being applied to board 101, and dispensing tool inspection that judges whether the type of dispensing tool attached to dispensing head 220 is correct based on the dispensing nozzle image data.

Further, because center optical system 82*a* is adjusted such that dispensing nozzle 14 is in focus, dispensing related inspection is performed more appropriately. Also, because the center optical system 82*a* is adjusted such that suction nozzle 13 attached to nozzle position 13*a* of pickup head 120 is also in the field of view, it can also be used for attachment inspection. That is, center optical system 82*a* is used for both dispensing related inspection and attachment inspection. Note that, for attachment inspection, because only inspection for the presence of suction nozzle 13 is performed, inspection is possible even using image data based on light received via center optical system 82*a* for which the focus is not correct.

Further, because left optical system 82*b* and right optical system 82*c* are adjusted such that suction nozzles 13 at nozzle positions 13*b* and 13*c* are in focus, component related inspection is performed more appropriately. That is, within component related inspection, component pickup state pickup, for which inspection is relatively difficult if the focus is not correct, can be performed appropriately using left optical system 82*b* and right optical system 82*c*.

Also, nozzle camera 124 is attached to head holding body 21 via main body frame 90 to be one unit. Thus, it is easier to appropriately maintain the positional relationship between the head held by head holding body 21 and nozzle camera 124 during imaging, such that it is easier to acquire appropriate suction nozzle image data and dispensing nozzle image data. More specifically, because head holding body 21 and nozzle camera 124 move as one in the XY direction, it is easy to appropriately maintain the positional relationship in the XY direction of suction nozzle 13 and dispensing nozzle 14 of the head and nozzle camera 124. Also, the raising/lowering mechanism that raises/lowers head holding body 21, and which is not shown, moves head holding body 21. Therefore, for example, by changing the positional relationship of nozzle camera 124 and the head held by head holding body 21 during imaging by nozzle camera 124 during application of adhesive or component mounting, a more appropriate positional relationship can be maintained based on the condition of nozzle camera 124 and the head. Also, the head can be moved to an appropriate imaging position simply by moving head holding 21 up/down when imaging.

Meanwhile, it goes without saying that the disclosure is not limited to the above-mentioned embodiment and various embodiments may be applied within the technical scope of the disclosure.

For example, in the above embodiment, center optical system 82*a* has a field of view including suction nozzle 13 in nozzle position 13*a*, but the field of view does not have to include suction nozzle 13 in nozzle position 13*a*. In this case, dispensing related inspection can be performed using center optical system 82*a*. Also, in this case, attachment inspection of suction nozzle 13 that is performed using center optical system 82*a* in the present embodiment may be performed using left optical system 82*b* and right optical system 82*c*.

In the above embodiment, optical system unit 80 is provided with center optical system 80*a*, left optical system 82*b*, and right optical system 82*c*, but only center optical system 82*a* need be provided. That is, at least one of left optical system 82*b* and right optical system 82*c* need not be provided in optical system unit 80. In a case in which optical system unit 80 is not provided with one of left optical system 82*b* and right optical system 82*c*, component related inspection may be performed with the other of left optical system 82*b* and right optical system 82*c*. Also, in a case in which optical system unit 80 is provided with neither of left optical system 82*b* and right optical system 82*c*, dispensing related inspection and attachment inspection may be performed using center optical system 82*a*.

In the embodiment described above, center optical system 82*a*, left optical system 82*b*, and right optical system 82*c* share mirror 86*a*; other mirrors, prisms, and so on may also be shared, or independent optical systems that do not share items may be used.

In the embodiment described above, image data was acquired that shows one image in which images of the center, left side, and right side are arranged based respectively on light received via center optical system 82*a*, left optical system 82*b*, and right optical system 82*c*. For example, for nozzle camera 124, a shielding plate that switches to and from a state in which light is received by opening/closing may be provided on each of center incidence opening 83*a*, left incidence 83*b*, and right incidence opening 83*c*. By this, by opening only the shielding plate for the optical system for which you to acquire data, an image can be obtained for each optical system.

In the embodiment described above, CPU 162 performs dispensing nozzle inspection, dripping inspection, and application good/bad inspection as dispensing related inspection; however, inspection is not limited to this, so long as inspection relates to at least one of dispensing nozzle 14 and adhesive dispensed from the dispensing outlet of dispensing nozzle 14. For example, one or more of dispensing nozzle inspection, dripping inspection, and application good/bad inspection may be omitted, or another inspection may be added. The timing to perform inspection is also not limited to that of the embodiment described above.

In the embodiment described above, CPU 162 performs attachment inspection and component pickup state inspection as component related inspection; however, inspection is not limited to this, so long as inspection relates to at least one of suction nozzle 13 and the component held by suction nozzle 13. Also, another inspection may be performed instead of either of attachment inspection and component pickup state inspection. For example, as another inspection, suction nozzle inspection that judges the type of suction nozzle 13 attached to pickup head 120 may be performed. Suction nozzle inspection may be performed, for example, based on the diameter of suction nozzle 13 (the left-right width in the image data), in a similar manner to dispensing nozzle inspection. This type of inspection is desirably performed using left optical system 82*b* or right optical system 82c for which suction nozzle 13 is in focus. Alternatively, missing component inspection that inspects for a component remaining on suction nozzle 13 (a missing component) may be performed on suction nozzle 13 after mounting of the component on board 101. Missing component inspection may be performed, for example, in a similar to attachment inspection, by judging whether a dark shape is present at the tip of suction nozzle 13. Note that, to enable judgment for even small components, this type of inspection is desirably performed using left optical system 82b or right optical system 82c for which suction nozzle 13 is in focus.

In the embodiment described above, CPU 162 performs attachment inspection each time head holding section 21 switches one suction nozzle 13; however, inspection may be performed after switching of all suction nozzles 13 has been completed. In this case, not only center optical system 82a may be used for attachment inspection, but left optical system 82b and right optical system 82c may be used, and attachment inspection may be performed for multiple suction nozzles 13 simultaneously. Also, CPU 162 performs component pickup state inspection after all suction nozzles 13 have picked up a component; however, component pickup state inspection may be performed each time one component is picked up by a suction nozzle 13. In this case, inspection may be performed at one of left optical system 82b and right optical system 82c.

The mechanism for moving nozzle camera 124 up and down in the embodiment described above may be provided on head unit 110. In this way, nozzle camera 124 is moved to an appropriate imaging position by moving nozzle camera 124 up or down.

In the embodiment described above, in the suction nozzle image data and dispensing nozzle image data, the background is bright and the target object is dark, but embodiments are not limited to this. For example, in the image data, the background may be dark and the target object bright. In this case, the visible reflectance of the surfaces of background body 44 and background plate 72 may be low, such as by the surfaces of background body 44 and background plate 72 being black, and imaging performed by nozzle camera 124 after light source 81 emits visible light.

In the above embodiment, suction nozzles 13 of pickup head 120, and dispensing nozzle 14 of dispensing head 220 are detachable, but at least one of suction nozzle 13 and dispensing nozzle 14 may be attached to the head in a non-detachable manner.

In the above embodiment, dispensing head 220 dispenses adhesive, but embodiments are not limited to adhesive, and viscous fluids such as solder or brazing material may be dispensed. Also, component mounting device 100 is provided with one each of a pickup head 120 and a dispensing head 220, but multiple types (for example, types with different quantities of nozzles) of pickup head 120 and dispensing head 220 may be provided.

INDUSTRIAL APPLICABILITY

The present disclosure may be used in the technical field of component mounting devices that perform application of viscous fluids on a board and mounting of held components on a board.

REFERENCE SIGNS LIST

1: component mounting system; 12: nozzle holder; 13: suction nozzle; 13a to 13c: nozzle position; 14: dispensing nozzle; 21: head holding body; 22: R axis; 24: R-axis gear; 25: R-axis motor; 27: Q-axis gear; 28: Q-axis motor; 31: engaging member; 33: cylinder gear; 34: small gear; 36: base; 37: engaging hole; 38: pressure supply opening; 39: nozzle operation lever; 40: spring; 44: background body; 61: clutch member; 62: clutch member; 70: main body section; 72: background plate; 74: background plate operation lever; 76, 76: guide grooves; 80: optical system unit; 80a: upper cover; 81: light source; 82a: center optical system; 82b: left optical system; 82c: right optical system; 83a: center incident opening; 83b: left incident opening; 83c: right optical system; 84a: center cover; 84b: left cover; 84c: right cover; 85b, 85c: prism; 86a to 86c: mirror; 90: main body frame; 92: support shaft; 94: camera main body; 100: component mounting device; 101: board; 102: base; 104: board conveyance device; 106: support plate; 108: conveyor belt; 110: head unit; 112: X-axis slider; 114: guide rail; 116: Y-axis slider; 118: guide rail; 120: pickup head; 124: nozzle camera; 134: nozzle stocker; 140: head storage area; 142: storage location; 150: reel unit; 152: feeder; 154: reel; 160: controller; 162: CPU; 164: ROM; 166: RAM; 168: HDD; 200: management computer; 220: dispensing head

The invention claimed is:

1. A component mounting device that performs applying of a viscous fluid to a board and mounting of a held component to a board, the component mounting device comprising:
   a storing device that stores multiple types of heads that include a mounting head with a component holding tool that holds and releases a component, and a dispensing head with a dispensing tool that dispenses the viscous fluid from a dispensing outlet;
   a head holding device that exchangeably holds the heads;
   a head moving device that moves the head holding device;
   a head exchange control device that exchanges one of the mounting head and the dispensing head being held on the head holding device for the other of the mounting head and the dispensing head by controlling the head moving device and exchanging the head being held on the head holding device for the head stored in the storing device;
   an imaging device that, in a case in which the head holding device is holding the mounting head, images the component holding tool of the mounting head from the side and acquires component holding tool image data, and in a case in which the head holding device is holding the dispensing head, images the dispensing tool of the dispensing head from the side and acquires dispensing tool image data; and
   an inspection device that performs component related inspection of at least one of the component holding tool and the component held by the component holding tool based on the component holding tool image data, and that performs dispensing related inspection of at least one of the dispensing tool and the viscous fluid dispensed from the dispensing outlet of the dispensing tool based on the dispensing tool image data.

2. The component mounting device according to claim 1, wherein the inspection device performs the dispensing related inspection that includes at least one of application good/bad inspection that judges whether application is good/bad by detecting viscous fluid on the dispensing outlet based on the dispensing tool image data imaged after viscous fluid has been applied on the board from the dispensing tool, dripping inspection that judges whether viscous fluid is dripping from the dispensing outlet based on the dispensing tool image data image when viscous fluid is not being applied to the board, and dispensing tool inspection that judges whether the type of dispensing tool used by the dispensing head is correct based on the dispensing tool image data.

3. The component mounting device according to claim 1, wherein the component holding tool is detachable from the mounting head, the imaging device includes a first optical system that is adjusted such that, when the dispensing head is held by the head holding device, the dispensing tool of the held dispensing head is in focus, and, when the mounting head is held by the head holding device, the component holding tool attached to the held mounting head is in the field of view, and the inspection device performs the dispensing related inspection based on the dispensing tool image data imaged by the imaging device using the first optical system, and performs component related inspection that includes mounting inspection which inspects whether the component holding tool is attached to the mounting head based on the component holding tool image data imaged by the imaging device using the first optical system.

4. The component mounting device according to claim 1, wherein the imaging device includes a first optical system adjusted such that, when the dispensing head is held by the head holding device, the dispensing tool of the held dispensing head is in focus, and a second optical system adjusted such that, when the mounting head is held by the head holding device, the component mounting tool of the held mounting head is in focus, and the inspection device performs the dispensing related inspection based on the dispensing tool image data imaged by the imaging device using the first optical system, and performs component related inspection based on the component holding tool image data imaged by the imaging device using the second optical system.

5. The component mounting device according to claim 1, wherein multiple holding tools are attachable/detachable to/from the mounting head, the imaging device includes a first optical system that is adjusted such that, when the dispensing head is held by the head holding device, the dispensing tool of the held dispensing head is in focus, and, when the mounting head is held by the head holding device, the component holding tool attached to a first position of the held mounting head is in the field of view, and a second optical system adjusted such that, when the mounting head is held by the head holding device, the component mounting tool positioned at a second position different to the first position of the held mounting head, is in focus, and the inspection device performs the dispensing related inspection based on the dispensing tool image data imaged by the imaging device using the first optical system, performs the component related inspection including attachment inspection that inspects whether the component holding tool is attached to the first position based on the component holding tool image data image by the imaging device using the first optical system, and performs inspection related to a component held by the component holding tool positioned at the second position based on the component holding tool image data imaged by the imaging device using the second optical system.

6. The component mounting device according to claim 1, wherein the imaging device is provided as one unit with the head holding device.

* * * * *